United States Patent
Nikitin et al.

(10) Patent No.: US 10,170,518 B2
(45) Date of Patent: Jan. 1, 2019

(54) SELF-ASSEMBLED PATTERN PROCESS FOR FABRICATING MAGNETIC JUNCTIONS USABLE IN SPIN TRANSFER TORQUE APPLICATIONS

(71) Applicant: Samsung Electronics Co., LTD., Gyeonggi-do (KR)

(72) Inventors: Vladimir Nikitin, Campbell, CA (US); Dmytro Apalkov, San Jose, CA (US); Sebastian Schafer, Fremont, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/659,613

(22) Filed: Jul. 25, 2017

(65) Prior Publication Data
US 2018/0350873 A1    Dec. 6, 2018

Related U.S. Application Data

(60) Provisional application No. 62/512,656, filed on May 30, 2017.

(51) Int. Cl.
| | |
|---|---|
| *H01L 27/22* | (2006.01) |
| *H01L 43/08* | (2006.01) |
| *H01L 43/10* | (2006.01) |
| *H01L 43/12* | (2006.01) |
| *G11C 11/16* | (2006.01) |

(52) U.S. Cl.
CPC ............ *H01L 27/222* (2013.01); *H01L 43/08* (2013.01); *H01L 43/10* (2013.01); *H01L 43/12* (2013.01); *G11C 11/1673* (2013.01); *G11C 11/1675* (2013.01)

(58) Field of Classification Search
CPC ......... H01L 43/08; H01L 43/10; H01L 43/12; H01L 27/222; G11C 11/1673; G11C 11/1675
See application file for complete search history.

(56) References Cited

U.S. PATENT DOCUMENTS

| | | | |
|---|---|---|---|
| 7,807,278 | B2 | 10/2010 | Sugiomoto |
| 7,820,064 | B2 | 10/2010 | Jin |
| 8,470,462 | B2 | 6/2013 | Horng |
| 9,006,849 | B2 | 4/2015 | Guo |
| 9,362,490 | B1 | 6/2016 | Xiao |
| 9,437,654 | B2 | 9/2016 | Lee |

(Continued)

*Primary Examiner* — Yosef Gebreyesus
(74) *Attorney, Agent, or Firm* — Van Pelt, Yi & James LLP

(57) ABSTRACT

Magnetic junctions usable in a magnetic device and a method for providing the magnetic junctions are described. A patterned seed layer is provided. The patterned seed layer includes magnetic seed islands interspersed with an insulating matrix. At least a portion of the magnetoresistive stack is provided after the patterned seed layer. The magnetoresistive stack includes at least one magnetic segregating layer. The magnetic segregating layer(s) include at least one magnetic material and at least one insulator. The method anneals the at least the portion of the magnetoresistive stack such that the at least one magnetic segregating layer segregates. The constituents of the magnetic segregating layer segregate such that portions of magnetic material(s) align with the magnetic seed islands(s) and such that portions of the insulator(s) align with the insulating matrix.

15 Claims, 10 Drawing Sheets

(56) References Cited

U.S. PATENT DOCUMENTS

| | | | |
|---|---|---|---|
| 2012/0168885 A1* | 7/2012 | Apalkov | G11C 11/161 257/421 |
| 2014/0063921 A1* | 3/2014 | Tang | G11C 11/16 365/158 |
| 2015/0035099 A1* | 2/2015 | Apalkov | H01L 43/08 257/427 |
| 2016/0254017 A1 | 9/2016 | Nakata | |
| 2017/0054073 A1 | 2/2017 | Wang | |

* cited by examiner

SELF-ASSEMBLED PATTERN PROCESS FOR FABRICATING MAGNETIC JUNCTIONS USABLE IN SPIN TRANSFER TORQUE APPLICATIONS

CROSS-REFERENCE TO RELATED APPLICATIONS

This application claims the benefit of provisional Patent Application Ser. No. 62/512,656, filed May 30, 2017, entitled SELF-ASSEMBLED PATTERNING PROCESS FOR MAGNETIC DEVICES SUCH AS SPIN TRANSFER TORQUE MAGNETIC RANDOM ACCESS MEMORIES, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction.

A conventional magnetic tunneling junction (MTJ) may be used in a conventional STT-MRAM. The MTJ includes a pinned layer, a free layer and a tunneling barrier layer between the pinned and free layers. The MTJ typically resides on a substrate and may include seed and capping layer(s) as well as an antiferromagnetic (AFM) pinning layer adjoining the pinned layer. A bottom contact below the MTJ and a top contact on the MTJ may be used to drive current through the MTJ in a current-perpendicular-to-plane (CPP) direction.

The pinned layer and the free layer are magnetic. The magnetization of the pinned layer is fixed, or pinned, in a particular direction. The free layer has a changeable magnetization. The free layer and the pinned layer may each be a single layer or include multiple layers. The pinned layer and free layer may have their magnetizations oriented perpendicular to the plane of the layers (perpendicular-to-plane) or in the plane of the layers (in-plane).

To switch the magnetization of the conventional free layer, a current is driven perpendicular to plane. The current becomes spin polarized and exerts a spin torque on the magnetic moment of the free layer. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

To fabricate conventional MTJs in a STT-MRAM, the layers in the MTJ are blanket deposited across the surface of the substrate. These layers form an MTJ stack. Layers for the pinned layer, the nonmagnetic spacer layer and the free layer are all included in the MTJ stack. Additional layers such as seed and/or capping layers may also be part of the MTJ stack. Once the entire MTJ stack is deposited, a mask is provided. The mask covers the regions where the MTJs are to be formed and has apertures between the MTJs. The exposed portions of the MTJ stack are then removed. This removal may be accomplished via processes such as reactive ion etches (RIEs) and/or ion milling. Thus, the individual MTJs are defined from the MTJ stack. Fabrication of the STT-MRAM may then be completed. For example, insulating refill, conductive lines, and other components maybe formed.

High density STT-MRAM devices are increasingly desired. The spacing between memory cells and, therefore, the conventional MTJs continues to shrink. The height of the MTJ stack does not necessarily decrease with the reduction in spacing. Consequently, the aspect ratio (height divided by width or height divided by length) may increase. As the spacing between MTJs decreases and the aspect ratio increases, fabrication may become more challenging. For example, ion milling may be incapable of defining the MTJs at smaller spacing and higher aspect ratios. Further, because the MTJs have multiple layers of various materials, no single RIE chemistry is currently available for fabrication. Accordingly, what is needed is a method and system that may improve fabrication of spin transfer torque based memories. The method and system described herein address such a need.

BRIEF SUMMARY OF THE INVENTION

Magnetic junctions usable in a magnetic device and a method for providing the magnetic junctions are described. A patterned seed layer is provided. The patterned seed layer includes magnetic seed islands interspersed with an insulating matrix. Magnetic seed islands may be magnetic or nonmagnetic. A magnetic seed island is a seed structure for a magnetic structure. At least a portion of the magnetoresistive stack is provided after the patterned seed layer. The portion of the magnetoresistive stack includes at least one magnetic segregating layer. The magnetic segregating layer(s) include at least one magnetic material and at least one insulator. The method anneals at least the portion of the magnetoresistive stack such that the at least one magnetic segregating layer segregates. The constituents of the magnetic segregating layer segregate such that portions of magnetic material(s) align with the magnetic seed islands(s) and such that portions of the insulator(s) align with the insulating matrix.

DETAILED DESCRIPTION OF THE INVENTION

Figure 1:
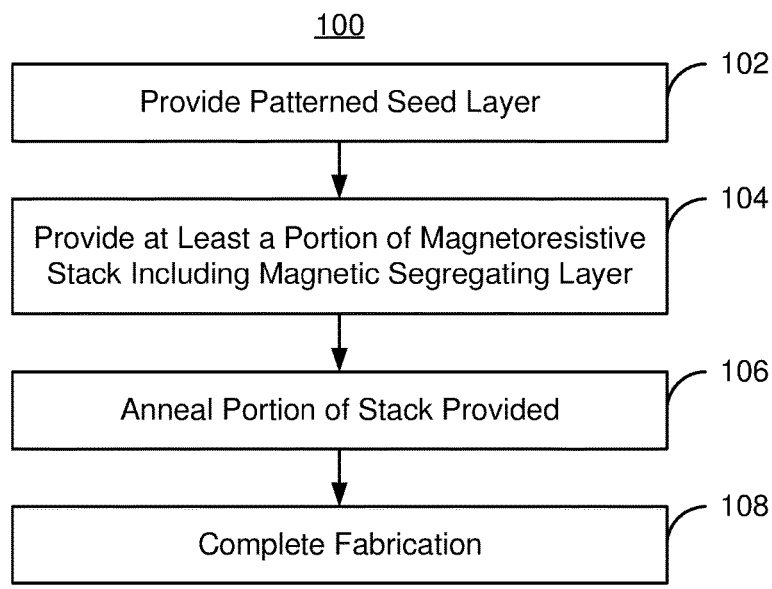
FIG. 1 is a flow chart depicting an exemplary embodiment of a method for providing self-assembled magnetic junctions usable in magnetic devices such as a magnetic memory programmable using spin transfer torque.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Magnetic junctions usable in a magnetic device and a method for providing the magnetic junctions are described. A patterned seed layer is provided. The patterned seed layer includes magnetic seed islands interspersed with an insulating matrix. Magnetic seed islands may be magnetic or nonmagnetic. A magnetic seed island is a seed structure for a magnetic structure. At least a portion of the magnetoresistive stack is provided after the patterned seed layer. This portion of the magnetoresistive stack includes at least one magnetic segregating layer. The magnetic segregating layer(s) include at least one magnetic material and at least one insulator. The method anneals the at least portion of the magnetoresistive stack such that the at least one magnetic segregating layer segregates. The constituents of the magnetic segregating layer segregate such that portions of magnetic material(s) align with the magnetic seed islands(s) and such that portions of the insulator(s) align with the insulating matrix.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, crystallization, segregation of immiscible materials and other physical phenomenon. Consequently, one of ordinary skill in the art will readily recognize that theoretical explanations of the behavior of the method and system are made based upon this current understanding. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

FIG. 1 is a flow chart depicting an exemplary embodiment of a method 100 for providing self-assembled magnetic junctions programmable using spin transfer torque. The magnetic junctions provided may be usable in magnetic devices such as a STT-MRAM and, therefore, in a variety of electronic devices. Each of the magnetic junctions formed using the method 100 includes at least a free layer having a changeable magnetic moment, a pinned layer and a non-magnetic spacer layer such as a crystalline MgO layer. The free and/or pinned layers of the magnetic junction may have a high perpendicular magnetic anisotropy (PMA). Stated differently, the perpendicular magnetic anisotropy energy may exceed the out-of-plane demagnetization energy. FIGS. 2-5 depict side views of an exemplary embodiment of a magnetic device 200 during fabrication using the method 100. In some embodiments, the magnetic device 200 is an STT-MRAM. FIGS. 2-5 are not to scale and only structures that may be of interest are separately labeled and included. Referring to FIGS. 1-5, the method 100 is described in the context of the magnetic device 200. However, other magnetic devices including other magnetic junction(s) may be formed. Further, the method 100 may start after other steps in forming the magnetic device 200 have been performed. For example, selection transistor(s), contacts, or other components may have been fabricated. For simplicity, some steps may be omitted, performed in another order, include substeps and/or combined.

A patterned seed layer is provided, via step 102. The patterned seed layer includes magnetic seed islands interspersed with an insulator. Magnetic seed islands may be magnetic or nonmagnetic. A magnetic seed island is so named because a magnetic seed island is a seed layer for a subsequent magnetic structure, such as the magnetic segregating layer(s) described below. The magnetic seed islands may be conductive (e.g. metallic). The insulator may be considered to form an insulating matrix that surrounds each of the magnetic seed islands. Step 102 may include depositing a seed layer for the magnetic junction to be provided, patterning the seed layer photolithographically to form the magnetic seed islands using a mask and depositing an insulating layer. Portions of the insulating layer might be removed prior to the mask being removed. Alternatively, the mask may be removed without a separate insulator removal step. Removal of the mask may remove excess insulating layer, leaving the insulating matrix and magnetic seed islands. Alternatively, the insulating layer may be deposited. A mask may cover the portions of the insulating layer that are to form the insulating matrix. The exposed portions of the insulating layer are removed. The seed layer for the magnetic junctions may then be deposited. Some of the seed layer may be etched prior to removal of the mask. Alternatively, the mask may simply be removed. Removal of the mask may remove excess seed layer. In either process, magnetic seed islands in the insulating matrix remain. In other embodiments, other methods may be used to form the patterned seed layer.

Figure 2:
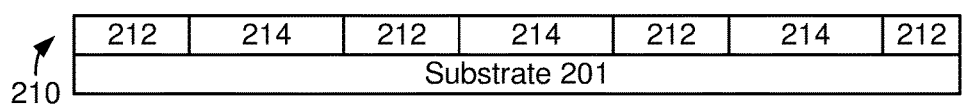
FIGS. 2-5 depict an exemplary embodiment of self-assembled magnetic junctions during fabrication.

FIG. 2 depicts the magnetic device 200 after step 102 has been performed. The patterned seed layer 210 has been provided on the substrate 201. The seed layer 210 includes magnetic seed islands 214 interspersed with an insulating matrix 212. Although only one dimension in-plane is shown (e.g. left to right), the patterned seed layer 210 is typically patterned in two dimensions. Thus, the length and width of the magnetic seed islands 214 as well as the distance between the islands (e.g. the length of the insulating matrix 212) are provided as part of step 102. In some embodiments, each magnetic seed island 214 corresponds to a single magnetic junction. In other embodiments, the seed island 214 may correspond to multiple magnetic junctions. For example, the seed island 214 may extend across multiple magnetic junctions in the direction out of the plane of the page if a single pinned layer is desired to be used for multiple magnetic junctions. In at least some embodiments, the shape of the footprint of the magnetic seed islands 214 corresponds to the footprint of the pinned or other magnetic layer(s) that will be adjacent to the magnetic seed islands 214. The desired dimensions of the magnetic seed islands 214 may differ for perpendicular and in-plane junctions. For perpendicular designs, the magnetic seed islands may have a circular footprint with a diameter as small as five nanometers and as large as one hundred nanometers. For in-plane magnetic junctions, the magnetic seed island may be elongated (e.g. elliptical) with short axis of at least ten nanometers and not more than one hundred nanometers and a long axis of at least twenty nanometers and not more than four hundred nanometers. However, other shapes (footprints) and/or sizes are possible. For example, a square and/or rectangular footprint may be used. Examples of materials that may be used for the magnetic seed islands 214 include but may not be limited to CrV, NiTa, RuAl, TiN and/or CrTi alloys.

The insulating matrix 212 may be an insulating material that enables segregation of the magnetic material and insulator of the magnetic segregating layer (described below) based on the seed layer. Oxides as well as Nitrides and oxynitride of various materials might be used. For example, materials such as AlO, AlN, SiO, SiN, MgO, MgN and/or TiO may be used. In some embodiments, the insulating matrix 212 may be silicon oxide or nitride, such as $SiO_2$ or $Si3N_4$. In another embodiment, the insulating matrix 212 may be another oxide including but not limited to aluminum oxide. The insulating matrix 212 may be used to electrically isolate the magnetic junctions being formed. Thus, the insulating matrix 212 may surround the sides of some or all of the magnetic seed islands 214.

A first portion of a magnetoresistive stack is provided, via step 104. The magnetoresistive stack includes one or more layers for the magnetic junction, but has not been patterned into individual magnetic junction(s). Thus, step 104 includes depositing one or more layers that will become part of the magnetic junction(s). At least one magnetic segregating layer is provided as part of step 104. A magnetic segregating layer includes at least one magnetic material and at least one insulator. The magnetic material(s) and insulator(s) are immiscible. Thus, step 104 may include sputtering or otherwise depositing these materials such that the resulting film is metastable. In some embodiments, only the magnetic segregating layer is deposited. In other embodiments additional layers might be deposited. For example, the nonmagnetic spacer layer may be provided as part of step 104. An MgO tunneling barrier layer may, therefore, be provided as part of step 104. The MgO deposited may not be fully crystallized until one or more anneals are performed, as discussed below. In some such embodiments, the material(s) for a free layer may be deposited. For example, an additional magnetic segregating layer may be deposited on the nonmagnetic spacer layer. This additional magnetic segregating layer may form the free layer. If a dual magnetic junction is to be provided, an additional nonmagnetic spacer layer and another magnetic segregating layer may also be deposited. Other layers such as polarization enhancement layers (PELs), coupling layers and antiferromagnetic (AFM) or other pinning layers and/or other layers that are to be photolithographically defined may be deposited at a later time. Further, although only a single magnetic segregating layer is described for each deposition above, in other embodiments, multiple magnetic segregating layers may be provided at each location.

Figure 3:
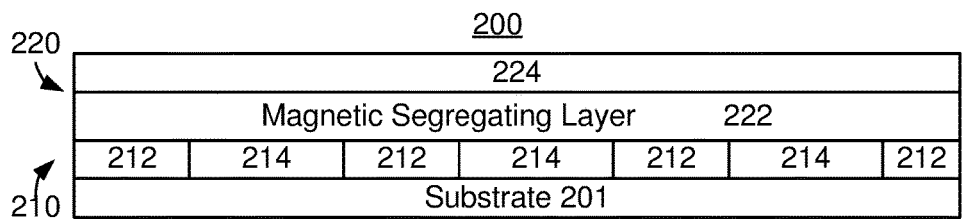

FIG. 3 depicts the magnetic device 200 after step 104 is performed. Thus, a portion of the magnetoresistive stack 220 has been formed. A magnetic segregating layer 222 has been deposited on the patterned seed layer 210. the magnetic segregating layer 222 may be desired to share an interface with at least the magnetic seed islands 214. In some embodiments, the magnetic segregating layer 222 shares an interface with the patterned seed layer 210. Although shown as a single layer, the magnetic segregating layer 222 may include multiple sublayers. For example, the magnetic segregating layer 222 may include a multilayer of thin layer(s) of the magnetic material(s) alternating with thin layer(s) of the insulator. However, in general, the magnetic material(s) and insulator(s) are desired to be intermixed due to the deposition process. For example, small particles of the magnetic material(s) may interspersed in a matrix formed of the insulator.

The magnetic segregating layer 222 may include FePt and/or CoPt as the magnetic material(s). Other magnetic materials that may segregate from the insulator, such as CoFeB, might also be used. The insulator may include silicon oxide, such as $SiO_2$, and/or aluminum oxide. Other oxides such as $B_2O_3$, AlN and/or MgO might also be used. In general, magnetic materials and oxides/insulators used are those that both provide the desired properties for the magnetic junction and are capable of segregating from each other based upon the seed islands 214 and insulating matrix 212. The stoichiometry of the magnetic segregating layer 222 may depend upon the size of the magnetic junctions in the plane perpendicular to the side view shown as well as the distance desired between the magnetic junctions. For example, a larger fraction of the magnetic segregating layer 222 may be the magnetic material(s) if magnetic junctions having larger footprints are desired. In some embodiments, the desired distance between magnetic junctions may affect the fraction of the insulator provided. For example, if the magnetic junctions are desired to be more distant in-plane, then a higher fraction of insulator may be provided as part of the magnetic segregating layer. A combination of the magnetic seed island 214 dimensions/separation (size of insulating matrix 212) and the proper ratio of magnetic material(s) to insulator(s) is used to achieve uniform size distribution and magnetic properties. One example volume fraction of insulator is ten volume percent through fifty volume percent (i.e. ninety through fifty volume percent magnetic material(s)).

Also shown in FIG. 3 is an optional additional portion 224 of the magnetoresistive stack 220. In some embodiments, the additional portion 224 of the magnetoresistive stack may include a tunneling barrier layer, layer(s) for the free layer, or other layers. If some or all of the free layer is part of the layer 224, then this portion of the free layer may include additional magnetic segregating layer(s). In other embodiments, the portion 224 may be omitted.

The portions of the magnetoresistive stack 220 that has been provided is annealed such that constituents of the magnetic segregating layer(s) 224 segregate, via step 106. The anneal may be accomplished via block heating (wafer in place on a heated chuck) or via a rapid thermal anneal (RTA) in various embodiments. The anneal temperature may be at least two hundred degrees Celsius and not more than seven hundred degrees Celsius in some embodiments. However, other times and/or temperatures are possible. Further, other anneal processes may be used. The magnetic material(s) in the magnetic segregating layer 224 separate from the insulator. The magnetic material(s) thus tend to form islands. Because of the presence of the magnetic seed islands 214, the magnetic material(s) tend to align with and share at least part of an interface with the magnetic seed islands 214. The magnetic materials may also be close in dimension and footprint shape to the magnetic seed islands 214. Similarly, the insulator tends to align with the insulating matrix 212.

Figure 4:
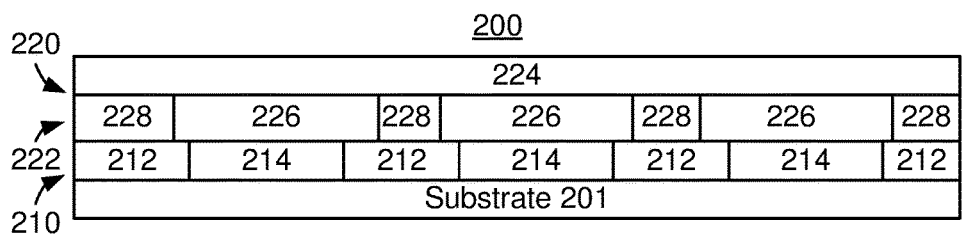

FIG. 4 depicts the magnetic device 200 after step 106 has been performed. Thus, the magnetic segregating layer 222 has separated into magnetic layers 226 and insulator layers 228 that are aligned with the magnetic seed islands 214 and insulating matrix 212, respectively. The magnetic layers 226 may but need not be centered over the magnetic seed islands 214 and may but need not be the same size as the islands 214. Similarly, the insulating layers 228 may but need not be centered over the insulating matrix 212 and may but need not be the same size as the insulating matrix 212. As used herein, a layer aligned with another layer overlaps the other layer by at least fifty percent. In some embodiments, a layer being aligned with another layer means that there is no cross-over between seed island and adjacent magnetic island. Although the magnetic layers 226 are shown as larger than the magnetic seed islands 214, the dimensions of the magnetic seed islands 214 can be either smaller or larger than the dimensions of the magnetic layers 226. Thus, the magnetic seed islands 214 may be smaller or larger than the desired footprint of the magnetic junction being formed. The choice is determined by segregation properties of the magnetic material(s) in the magnetic layers 226 as well as magnetic properties (such as perpendicular anisotropy) dependency of growth on metal (the magnetic seed islands 214) or insulator material 212. Thus, each magnetic layer 226 is aligned with a magnetic seed island 214. Similarly, each insulator layer 224 is aligned with the corresponding insulating matrix 212. The footprint of each magnetic layer 226 may also substantially match the footprint of the adjoining magnetic seed island 214. Consequently, the placement and shape of the magnetic layers 226 may be based at least in part on the patterned seed layer 210. Thus, the patterned seed layer 210 has provided a growth template for the magnetic layers 226. These magnetic layers 226 may form all or part of a bottom layer of the magnetic junctions being fabricated. In some embodiments, this layer 226 is all or part of the pinned layer. In an alternate embodiment, this magnetic layer 226 may be all or part of the free layer.

The additional portion 224 of the magnetoresistive stack 220 is shown as unchanged in FIG. 4. However, if the additional portion 224 of the magnetoresistive stack 220 includes magnetic segregating layer(s), then the constituents of these layers may segregate as described above.

Fabrication of the magnetic device 200 is then completed, via step 108. Step 108 may include patterning the layer 224, providing additional layer(s), patterning one or more of these layer(s) and providing additional components for the magnetic device 200.

Figure 5:
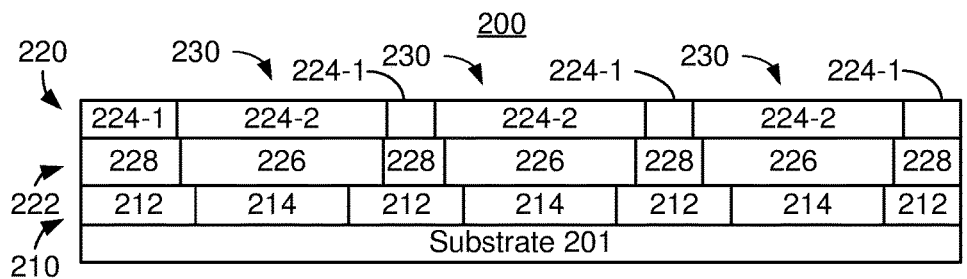

FIG. 5 depicts the magnetic device 200 after at least part of step 108 has been performed. Thus, the layer 224 may have been patterned and refilled. The layer 224 may have been segregated via the anneal in step 106 and/or through an additional anneal. Thus, portions 224-1 and 224-2 of the stack 220 are shown. Portions 224-1 may form part of the insulator surrounding the sides of the regions 224-2. The portions 224-2 may form the remaining part of each magnetic junction 230. Thus, portions 224-2 may include a nonmagnetic spacer layer such as a tunneling barrier layer and a free layer if the magnetic layer 226 is a pinned layer. Alternatively, the portions 224-2 may include a nonmagnetic spacer layer such as a tunneling barrier layer and a pinned layer if the magnetic layer 226 is the free layer. In some cases, the portions 224-2 may also include an additional nonmagnetic layer such as an additional tunneling barrier layer and an additional pinned layer if a dual magnetic junction is being fabricated. The nonmagnetic spacer layer need not be patterned if it is insulating. In addition, the portions 224-2 may include magnetic segregating layers that are fabricated similar to the magnetic layers 226/insulator layers 228. Moreover, the magnetic layer 226 may form only part of the pinned or free layer. In some embodiments, Consequently, the method 100 may form a bottom pinned magnetic junction (at least part of the pinned layer closest to the substrate 201 and formed by magnetic layer 226), a top pinned magnetic junction (at least part of the free layer closest to the substrate 201 and formed by magnetic layer 226), a dual magnetic junction (at least part of the lower pinned layer closest to the substrate 201 and formed by magnetic layer 226). Thus, the magnetic junctions 230 may be formed. In addition, electrodes, insulators, conductive lines and/or other structures may be provided.

Because the magnetic layers 226 are formed via an anneal and tend to align with the magnetic seed islands 214, the magnetic layers 226 are self-assembled. Consequently, the magnetic layers 226 need not be separately defined via a removal process such as RIE or ion milling. Instead, the shape, size and location of the magnetic layers 226 may be determined by the shape, size and location of the magnetic seed islands 214. These islands 214 may be patterned prior to deposition of any portion of the magnetoresistive stack 220. As a result, the distance between the magnetic layers 226 can be made small. Because the remaining portions 224-2 of the magnetic junctions 230 are thinner, any removal processes used in defining the remaining portions 224-2 may be for lower aspect ratios. Thus, the remaining portions 224-2 may be better able to be defined at higher areal densities. Further, if only one magnetic layer, such as a free layer, is present in the portions 224-2, then a single RIE etch chemistry and/or a single, short ion mill may be used. The magnetic junctions 230 may be more easily fabricated at smaller sizes and smaller spacings. Fabrication of a magnetic device 200 having higher areal density of magnetic junctions 230 may thus be achieved using the method 100.

Figure 6:
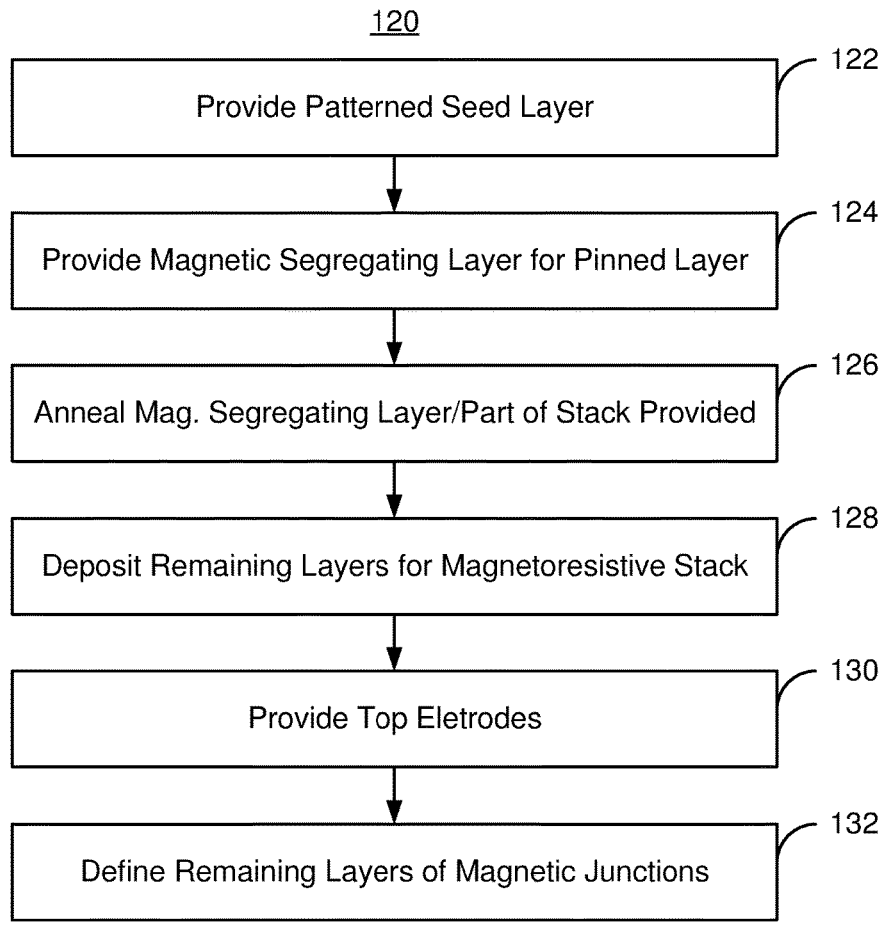
FIG. 6 is a flow chart depicting an exemplary embodiment of a method for providing self-assembled magnetic junctions usable in magnetic devices such as a magnetic memory programmable using spin transfer torque.

FIG. 6 is a flow chart depicting an exemplary embodiment of a method 120 for providing self-assembled magnetic junctions programmable using spin transfer torque. The magnetic junctions provided may be usable in magnetic devices such as a STT-MRAM and, therefore, in a variety of electronic devices. Each of the magnetic junctions formed using the method 120 includes at least a free layer having a changeable magnetic moment, a pinned layer and a nonmagnetic spacer layer such as a crystalline MgO layer. The free and/or pinned layers of the magnetic junction may have a high perpendicular magnetic anisotropy (PMA). Stated differently, the perpendicular magnetic anisotropy energy may exceed the out-of-plane demagnetization energy. Such a configuration allows for the magnetic moment of a high PMA layer to be stable perpendicular to plane. Additional layers including but not limited to polarization enhancement layers (PELs), other seed layer(s) and capping layer(s) may also be provided.

FIGS. 7-13 depict side views of exemplary embodiments of magnetic devices 250 and 250A during fabrication using the method 120. In some embodiments, the magnetic devices 250 and 250A are STT-MRAMs. FIGS. 7-13 are not to scale and only structures of interest are separately labeled and included. Referring to FIGS. 6-13, the method 120 is described in the context of the magnetic devices 250 and 250A including particular magnetic junctions. However, other magnetic devices including other magnetic junction(s) may be formed. Further, the method 120 may start after other steps in forming the magnetic device 250/250A have been performed. For example, selection transistor(s), contacts, or other components may have been fabricated. For simplicity, some steps may be omitted, performed in another order, include substeps and/or combined.

Figure 7:
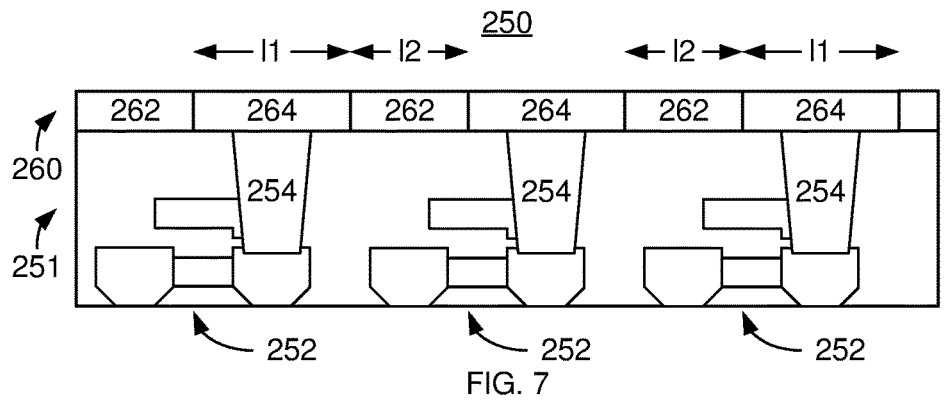
FIGS. 7-11 depict an exemplary embodiment of self-assembled magnetic junctions during fabrication.

A patterned seed layer is provided, via step 122. The patterned seed layer includes magnetic seed islands interspersed with an insulator. Step 122 is analogous to step 102 of the method 100. FIG. 7 depicts the magnetic device 250 after step 122 has been performed. The patterned seed layer 260 has been provided on the substrate 251. Selection transistors 252 and conductive vias 254 have also been formed prior to the patterned seed layer 260. The seed layer 260 includes magnetic seed islands 264 interspersed with an insulating matrix 262. Although only one dimension in the plane of the layers is shown (e.g. left-right), the patterned seed layer 260 is typically patterned in two dimensions. The patterned seed layer 260, magnetic seed islands 264 and insulating matrix 262 are analogous to patterned seed layer 210, magnetic seed islands 214 and insulating matrix 212, respectively. Consequently, the discussion above with respect to the patterned seed layer 210 is applicable to the patterned seed layer 260. The magnetic seed islands 264 may include one or more of CrV, NiTa, RuAl, TiN, CrTi and/or other appropriate materials. For example, the insulating matrix 262 may be silicon oxide, such as $SiO_2$ and the magnetic seed islands 264 are appropriate for the magnetic layer to be formed. Other insulating matrices may include but are not limited to AlO, AlN, SiO, SiN, MgO, MgN and TiO. The magnetic seed islands 264 are shown as having length l1, while the insulating matrix has length l2. In the embodiment shown, l2 is less than l1 (l2<l1). However, in other embodiments, other relationships may hold.

Figure 8:
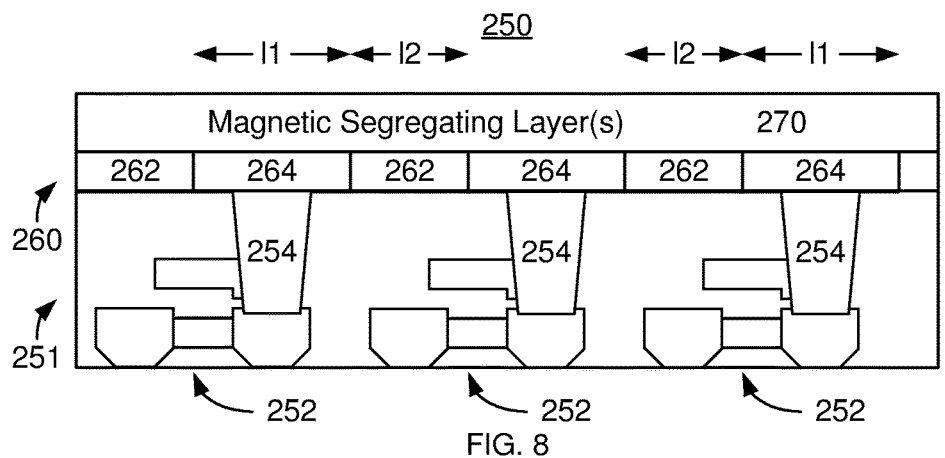

A magnetic segregating layer is provided, via step 124. A magnetic segregating layer includes at least one magnetic material and at least one insulator that are immiscible. For example, the magnetic material may be FePt and/or CoPt. The insulator might be $SiO_2$, alumina, $B_2O_3$, AlN and/or MgO. Other combinations of magnetic material(s) and/or insulator(s) might be used. Step 124 may include sputtering or otherwise depositing these materials such that the resulting film is metastable. Step 124 is thus analogous to at least part or step 104. FIG. 8 depicts the magnetic device 250 after step 124 is performed. A magnetic segregating layer 270 has been deposited on the patterned seed layer 210. The magnetic segregating layer 270 may share an interface with the patterned seed layer 260. The magnetic segregating layer 270 may be analogous to the magnetic segregating layer 222 discussed above. Although shown as a single layer, the magnetic segregating layer 270 may include multiple sublayers. The stoichiometry of the magnetic segregating layer 270 may depend upon the size of the magnetic junctions in the plane perpendicular to the side view shown as well as the distance desired between the magnetic junctions.

The magnetic segregating layer 270 is annealed so that its constituents segregate, via step 126. In various embodiments, the anneal may be accomplished via block heating or via RTA. In some embodiments, the anneal is at temperatures of at least two hundred degrees Celsius and not more than seven hundred degrees Celsius. In some embodiments, the annealing temperature may be compatible with semiconductor processes, for example nominally four hundred degrees Celsius. For an RTA, the anneal time may be at least one and not more than three thousand seconds. The annealing time for block heating may be on the order of at least one hundred seconds and not more than two hours. However, the annealing process is desired to take into account the underlying transistor temperature tolerance, through-via chip bonding technology, the magnetic properties of the junction and/or other factors. Thus, other temperatures and/or times are possible. The magnetic material(s) in the magnetic segregating layer 270 separate from the insulator. The magnetic material(s) thus tend to form islands. Because of the presence of the magnetic seed islands 264, the magnetic material(s) tend to align with and share at least part of an interface with the magnetic seed islands 264. Similarly, the insulator tends to align with the insulating matrix 262. In an alternate embodiment, the nonmagnetic spacer layer may also be provided in step 124 and undergo an anneal in step 126.

Figure 9:
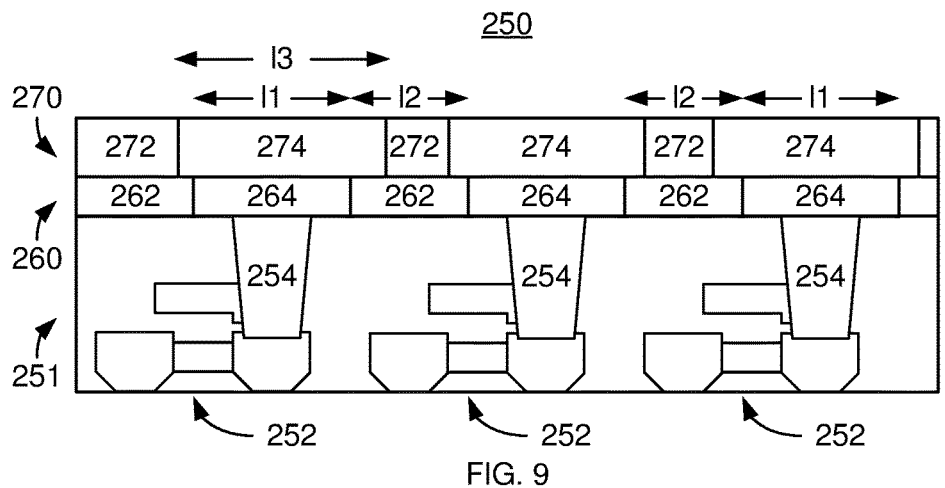

FIG. 9 depicts the magnetic device 250 after step 126 has been performed. Thus, the magnetic segregating layer 270 has separated into magnetic layers 274 and insulator layers 272 that are aligned with the magnetic seed islands 264 and insulating matrix 262, respectively. The magnetic layers 274 may but need not be centered over the magnetic seed islands 264 and may but need not be the same size as the islands 264. Similarly, the insulating layers 272 may but need not be centered over the insulating matrix 2612 and may but need not be the same size as the insulating matrix 262. The magnetic layers 274 have length l3. In the embodiment shown, the magnetic layers 274 are longer than the magnetic seed islands (l3>l1). However, in other embodiments, there may be other relationships between the lengths and/or depths perpendicular to the plane of the page. Thus, each magnetic layer 274 is aligned with a magnetic seed island 264, where alignment is defined above. Similarly, each insulator layer 272 is aligned with the corresponding insulating matrix 262. The footprint of each magnetic layer 274 may also substantially match the footprint of the adjoining magnetic seed island 264. Consequently, the placement and shape of the magnetic layers 274 may be based at least in part on the patterned seed layer 260. The patterned seed layer 260 has provided a growth template for the magnetic layers 274. These magnetic layers 274 may form all or part of a bottom layer of the magnetic junctions being fabricated. In some embodiments, this layer 274 magnetic is all or part of the pinned layer. In an alternate embodiment, this magnetic layer 274 may be all or part of the free layer.

The remaining layers of the magnetoresistive stack are deposited, via step 128. These layers may include but not be limited to the layer(s) for the nonmagnetic spacer layer and the free layer. Alternatively, the layers may be the nonmagnetic spacer layer and pinned layer. However, in general, it is preferred to have the free layer defined photolithographically for improved control over the dimensions and shape of the free layer. Thus, in some embodiments the magnetic layers deposited in step 128 are part of the free layer. The top electrode may be provided, via step 130. Step 130 may include depositing the layer for the top electrode and photolithographically defining the top electrodes.

Figure 10:
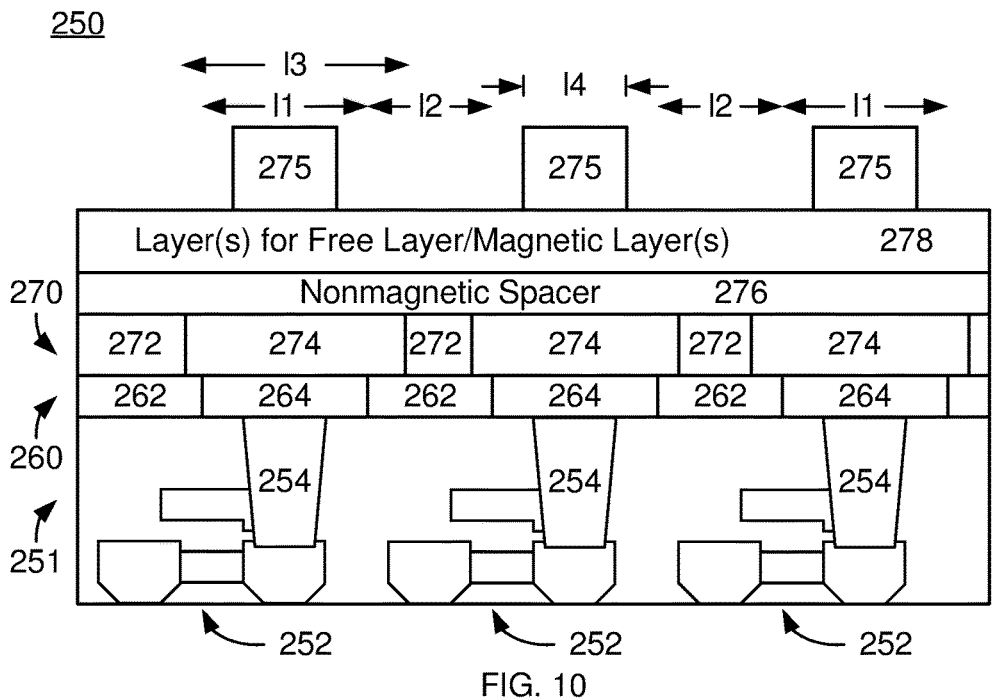

FIG. 10 depicts the magnetic device 250 after step 130 has been performed. Thus, the nonmagnetic spacer layer 276 and layer(s) for the free layer or pinned layer 278 have been provided in step 128. The nonmagnetic spacer layer 276 may be an MgO tunneling barrier layer. Thus, step 128 may include depositing an Mg layer and then oxidizing the Mg layer. Alternatively, an MgO layer may be deposited directly. In some embodiments, an anneal may be performed in order to improve crystallization of the MgO layer. The magnetic layer(s) 278 may be a single layer or a multilayer. The magnetic layer(s) 278 might form a SAF or may be another structure. The magnetic layer(s) 278 might include a PEL and/or other layers. The electrodes 275 are also shown. The electrodes have length l4. In the embodiment shown, the electrodes are shorter than the magnetic layers 274 (l4<l3). However, other relationships between the lengths are possible. Although the mask used in fabricating the electrodes 275 is not shown, in other embodiments the mask may be present.

The sides of the magnetic junctions are defined, via step 132. Step 132 include defining the edges of at least the magnetic layer(s) such as the free layer. In some embodiments, the nonmagnetic spacer layer is also defined. However, in embodiments in which the nonmagnetic spacer layer is a tunneling barrier layer, the edges of the nonmagnetic spacer layer might not be defined. In some embodiments, the electrode provided in step 130 and the mask used in providing the electrode may be used in step 132 to photolithographically define the edges of the magnetic junction. For example, a short ion mill and/or RIE may be performed to remove exposed portions of the magnetic layer(s) provided in step 128.

Figure 11:
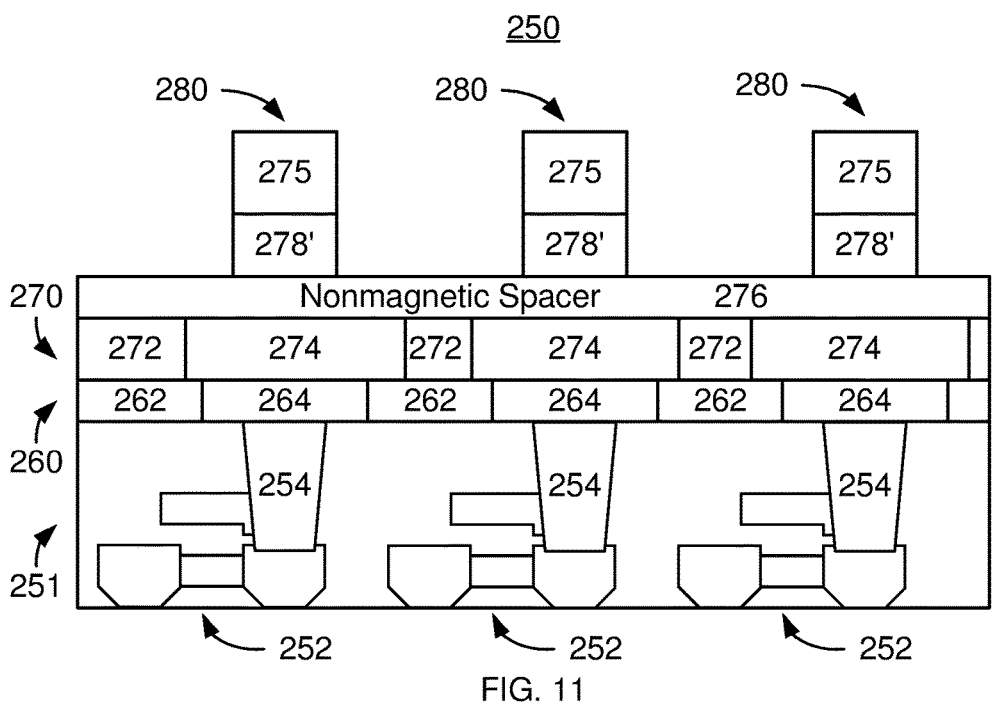

FIG. 11 depicts the magnetic device 250 after step 132 has been performed. In the embodiment shown, the magnetic layers 278' remain. Thus, the ion mill, RIE or other removal process has not removed all of the nonmagnetic spacer layer 276. Although shown as though the entire layer is present, in some embodiments, the process used to remove exposed portions of the magnetic layer(s) 278 may remove some or all of the exposed portions of the nonmagnetic spacer layer 276. As discussed above, the layers 278' may be free layers while the magnetic layers 274 may be pinned layers. Alternatively, the layers 278' and 274 may be pinned and free layers, respectively. For the reasons described above, it may be desirable for the layer 278 to be a free layer. Thus, the magnetic device 250 is fabricated.

Figure 12:
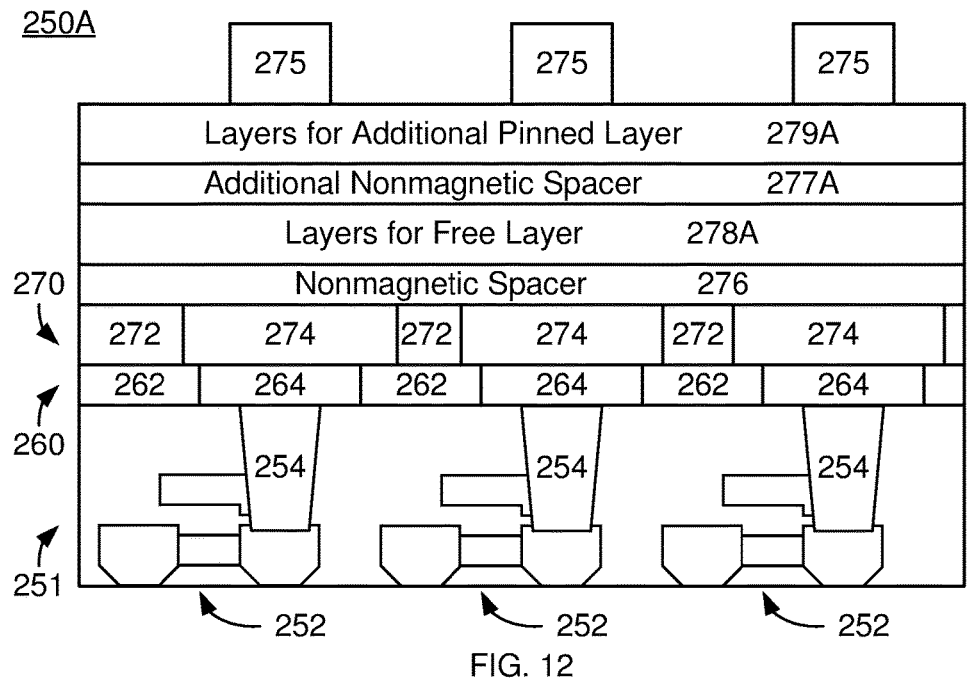
FIGS. 12-13 depict an exemplary embodiment of self-assembled magnetic junctions during fabrication.
Figure 13:
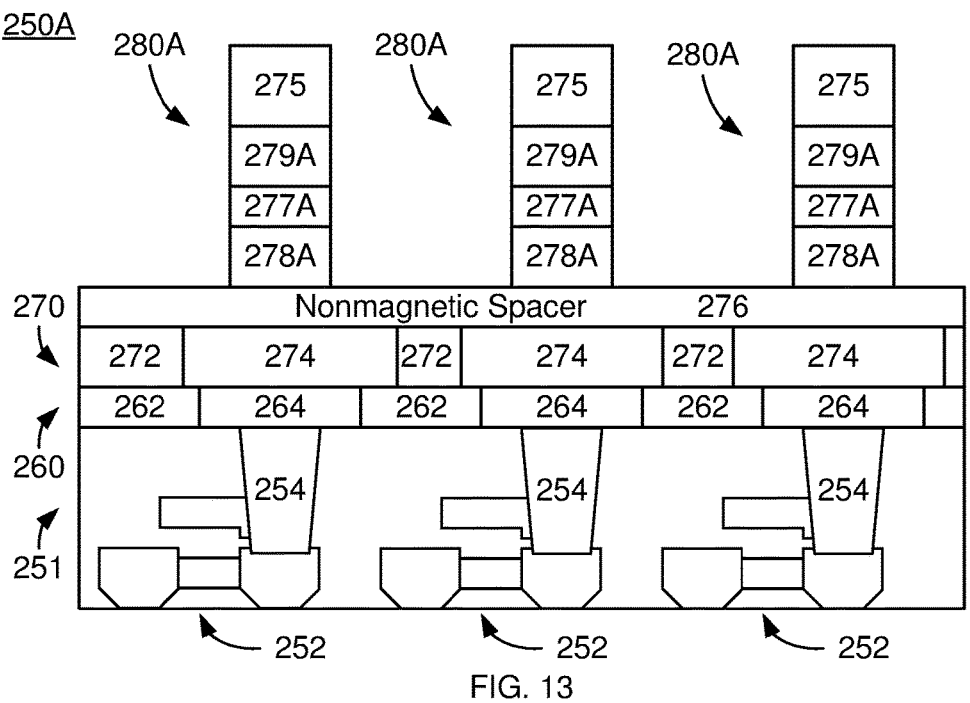

FIGS. 12-13 depicts an alternate embodiment of a magnetic device 250A in which step 128 deposits not only nonmagnetic spacer layer 276 and free layer 278 but also an additional nonmagnetic spacer layer 277A and an additional pinned layer 279A. The magnetic device 250A is analogous to the magnetic device 250. Consequently, similar components have analogous labels. FIG. 12 depicts the magnetic device 250A after step 130. Thus, the electrodes 275 have been formed. FIG. 13 depicts the magnetic device 250A after step 132 is performed. Thus, the free layer 278A, additional nonmagnetic spacer layer 277A and additional pinned layer 279A have been defined. Although shown as continuous, in some embodiments, step 132 might include removing an exposed portion of the nonmagnetic spacer layer 276. Consequently, dual magnetic junctions 280A have been formed.

The magnetic junctions 280 and/or 280A are formed using the method 120. The magnetic junction 280/280A may include a pinned layer 274, a nonmagnetic spacer layer 276 and free layer 278. Alternatively, the free layer might be formed by the magnetic layer 274 and the pinned layer formed with layer 278'. In some embodiments, a dual magnetic junction 280A may be formed. In such embodiments, the magnetic layer 274 is a pinned layer. The ensuing discussion assumes the magnetic layer 274 is the pinned layer. However, an analogous discussion holds if the free layer is the magnetic layer 274. The pinned layers 274 are formed via an anneal and tend to align with the magnetic seed islands 264. Thus, the pinned layers 274 are self-assembled. Consequently, the pinned layers 274 need not be separately defined via a removal process such as RIE or ion milling. Thus, only the free layer 278' or only the layers 278A, 277A and 279A may be patterned in step 132. Removal processes for high aspect ratio components may be reduced or avoided. As a result, the magnetic junctions 280 and/or 280A may be smaller and closer together. The magnetic device 200 may achieve a higher areal density. In addition, because only the free layer 278' may be defined in step 132, a single RIE chemistry or short ion mill may be used. Fabrication of a higher areal density magnetic device 250/250A may be facilitated.

Figure 14:
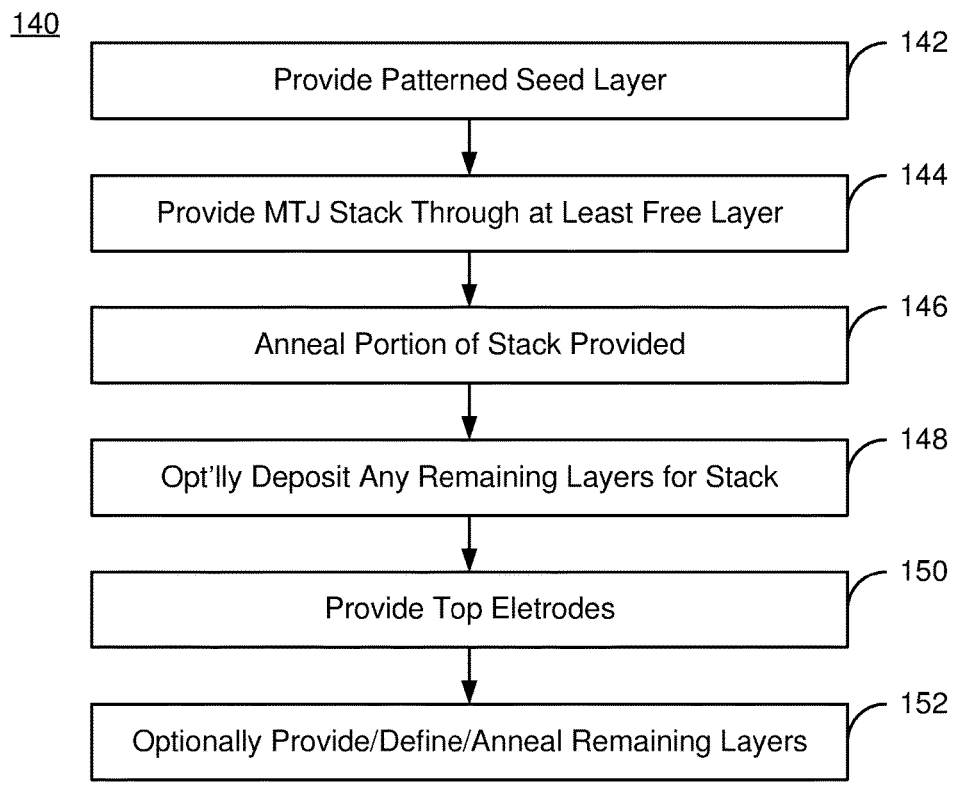
FIG. 14 is a flow chart depicting another exemplary embodiment of a method for providing self-assembled magnetic junctions usable in magnetic devices such as a magnetic memory programmable using spin transfer torque.

FIG. 14 is a flow chart depicting an exemplary embodiment of a method 140 for providing self-assembled magnetic junctions programmable using spin transfer torque. The magnetic junctions provided may be usable in magnetic devices such as a STT-MRAM and, therefore, in a variety of electronic devices. Each of the magnetic junctions formed using the method 140 includes at least a free layer having a changeable magnetic moment, a pinned layer and a nonmagnetic spacer layer such as a crystalline MgO layer. The free and/or pinned layers of the magnetic junction may have a high PMA. Such a configuration allows for the magnetic moment of a high PMA layer to be stable perpendicular to plane. Additional layers including but not limited to PELs, other seed layer(s) and capping layer(s) may also be provided.

FIGS. 15-21 depict side views of exemplary embodiments of a magnetic device 250B, 250C and 250D including magnetic junctions during fabrication using the method 140. The magnetic devices 250B, 250C and 250D are analogous to the magnetic devices 250 and 250A. Consequently, similar components have analogous labels. In some embodiments, the magnetic device 250B, 250C and 250D are each an STT-MRAM. FIGS. 15-21 are not to scale and only structures of interest may be separately labeled and included. Referring to FIGS. 14-21, the method 140 is described in the context of the magnetic devices 250B, 250C and 250D. However, other magnetic devices including other magnetic junction(s) may be formed. Further, the method 120 may start after other steps in forming the magnetic device 250B/250C/250D have been performed. For example, selection transistor(s), contacts, or other components may have been fabricated. For simplicity, some steps may be omitted, performed in another order, include substeps and/or combined.

Figure 15:
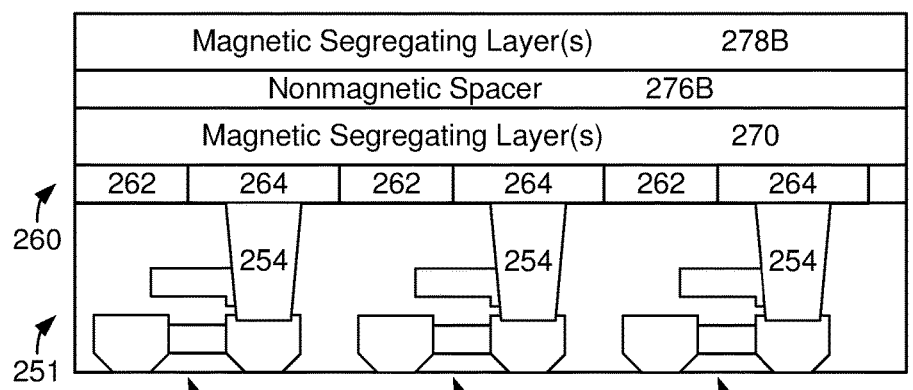
FIGS. 15-17 depict an exemplary embodiment of self-assembled magnetic junctions during fabrication.

A patterned seed layer is provided, via step 142. The patterned seed layer includes magnetic seed islands interspersed with an insulator. Step 142 is analogous to step 102 of the method 100 and to step 122 of the method 120. FIG. 15 depicts the magnetic device 250B after step 142 has been performed. The magnetic device 250B is analogous to the magnetic device(s) 250 and/or 250A. Consequently, similar components have analogous labels. The patterned seed layer 260 has been provided on the substrate 251. Selection transistors 252 and conductive vias 254 have also been formed prior to the patterned seed layer 260. The seed layer 260 includes magnetic seed islands 264 interspersed with an insulating matrix 262. The patterned seed layer 260, magnetic seed islands 264 and insulating matrix 262 are analogous to patterned seed layer 210, magnetic seed islands 214 and insulating matrix 212, respectively. Consequently, the discussion above with respect to the patterned seed layers 210 and 260 is applicable to the patterned seed layers 260 of the devices 250B, 250C and 250D. For example, the insulating matrix 262 may be silicon oxide, such as $SiO_2$, AlO, AlN, SiO, SiN, MgO, MgN and/or TiO. The magnetic seed islands 264 are appropriate for the magnetic layer to be formed. The magnetic seed islands 264 may include CrV, NiTa, RuAl, TiN, CrTi and/or other appropriate material(s). The magnetic seed islands 264 are shown as having length l1, while the insulating matrix has length l2. In the embodiment shown, l2 is less than l1 (l2<l1). However, in other embodiments, other relationships may hold.

At least part of a magnetoresistive stack including at least two magnetic segregating layers is provided, via step 144. A magnetic segregating layer includes at least one magnetic material and at least one insulator that are immiscible. For example, the magnetic material may be FePt and/or CoPt. In some embodiments, CoFeB might be used. The insulator might be $SiO_2$, alumina, $B_2O_3$, AlN and/or MgO. Other combinations of magnetic material(s) and/or insulator(s) might be used. The magnetic materials in one magnetic segregating layer provided in step 144 can but need not be the same as the magnetic material(s) in the other of the two magnetic segregating layers. Similarly, the insulator in one magnetic segregating layer can but need not be the same as the insulator(s) in the other of the two magnetic segregating layers, Step 144 may include sputtering or otherwise depositing these materials such that each resulting film is metastable. In addition, the nonmagnetic and/or other layer(s) between the magnetic segregation layers may be deposited as part of step 144.

FIG. 15 depicts the magnetic device 250B after step 144 is performed. A first magnetic segregating layer 270 has been deposited on the patterned seed layer 210. The magnetic segregating layer 270 may share an interface with the patterned seed layer 260. The magnetic segregating layer 270 may be analogous to the magnetic segregating layer 222 discussed above. Although shown as a single layer, the magnetic segregating layer 270 may include multiple sublayers. The stoichiometry of the magnetic segregating layer 270 may depend upon the size of the magnetic junctions in the plane perpendicular to the side view shown as well as the distance desired between the magnetic junctions. Also shown is the nonmagnetic spacer layer 276B and another magnetic segregating layer 278B. The magnetic segregating layer 278B is analogous to the layer 270. In some embodiments, the magnetic segregating layer 270 may be used for the pinned layer while the magnetic segregating layer 278B may be used for the free layer of each magnetic junction. Alternatively, the magnetic segregating layer 270 may be used for the free layer while the magnetic segregating layer 278B may be used for the pinned layer of each magnetic junction.

Figure 16:
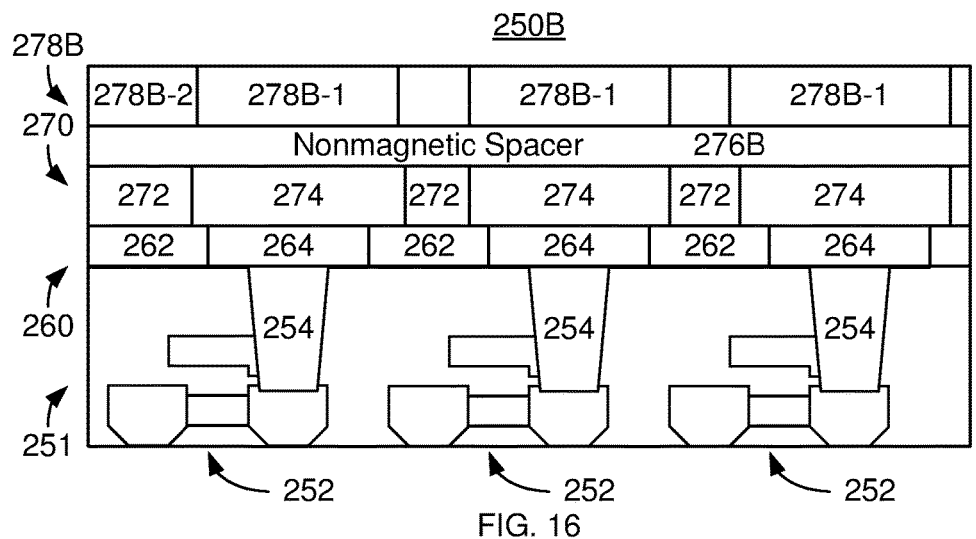

The magnetic segregating layers 270 and 278B are annealed so that the constituents of each layer segregate, via step 146. The anneal may be accomplished via a block anneal or an RTA. For example, the anneal temperatures may be at least two hundred degrees Celsius and not more than seven hundred degrees Celsius. For a block anneal the anneal time may be at least one hundred seconds and not more than two hours. For an RTA the anneal time may be at least one second and not more three thousand seconds. As discussed above, various factors may be taken into account. Thus, the time and/or temperature of the anneal may differ. The magnetic material(s) in the magnetic segregating layers 270 and 278B separate from the insulator. FIG. 16 depicts the magnetic device 250B after step 146 is performed. The magnetic material(s) thus tend to form islands. Because of the presence of the magnetic seed islands 264, the magnetic material(s) in the layer 270 tend to align with and share at least part of an interface with the magnetic seed islands 264. Similarly, the insulator 272 tends to align with the insulating matrix 262. Stated differently, crystal grain growth is promoted by atomic lattice crystallization. So, alignment of the multiple layers 264, 274 and 278B-1 and layers 262, 272 and 278B-2 occurs because of the grain segregation. This alignment is promoted by ensuring amount of the insulator in each layer 270 and 278 allows the grains to be of the same size. The footprint of each magnetic layer 274 may also substantially match the footprint of the adjoining magnetic seed island 264. Consequently, the patterned seed layer 260 has provided a growth template for the magnetic layers 274. These magnetic layers 274 may form all or part of a bottom layer of the magnetic junctions being fabricated. In some embodiments, this layer 274 magnetic is all or part of the pinned layer. In an alternate embodiment, this magnetic layer 274 may be all or part of the free layer. Similarly, the magnetic materials 278B-1 in the magnetic segregating layer 278B tend to align with the magnetic materials 274. The insulator 278B-2 tends to align with the insulator 272. For simplicity, only one region of the insulator 278B-2 is labeled.

The remaining layers of the magnetoresistive stack, if any, are deposited, via step 148. For the magnetic device 250B, there are no additional layers. The top electrode may be provided, via step 150. Step 150 may include depositing the layer for the top electrode and photolithographically defining the top electrodes.

Figure 17:
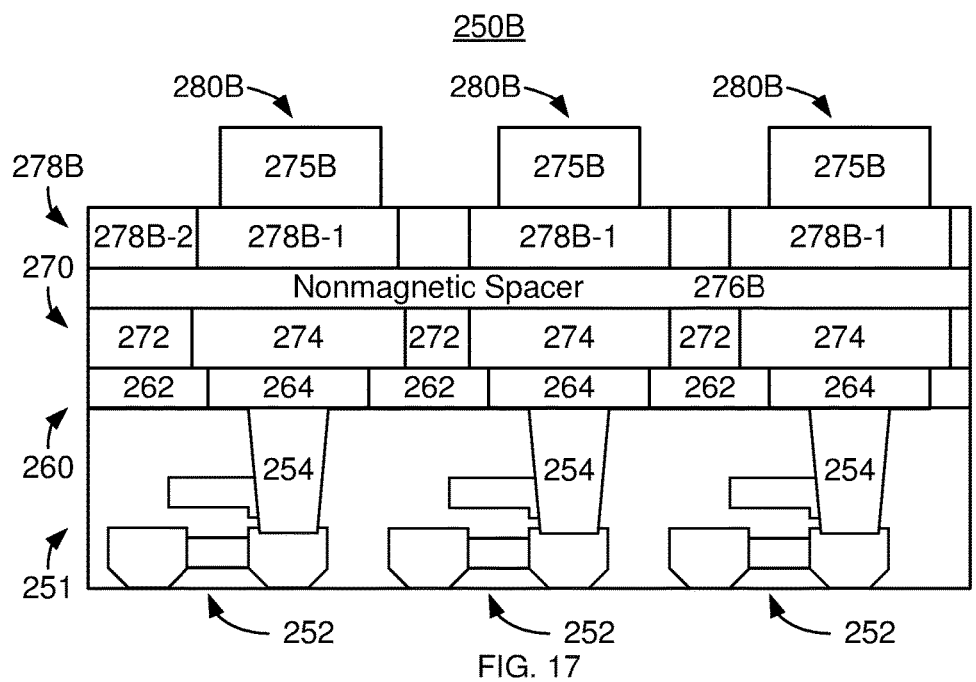

FIG. 17 depicts the magnetic device 250B after step 150 has been performed. Thus, the electrodes 275B are shown. In some embodiments, the magnetic layers 274 are the pinned layer and the magnetic layer 278B-1 are the free layer for each magnetic junction 280B. Alternatively, the magnetic layers 274 are the free layer and the magnetic layer 278B-1 are the pinned layer for each magnetic junction 280B.

Any remaining layers are optionally provided and defined, via step 152. Step 152 may be used if a dual magnetic junction is being provided. In some embodiments, step 152 is performed before step 150. Step 152 may be omitted for the magnetic device 250B. However, for the magnetic devices 250C and 250D, discussed below, step 152 may be performed.

Figure 18:
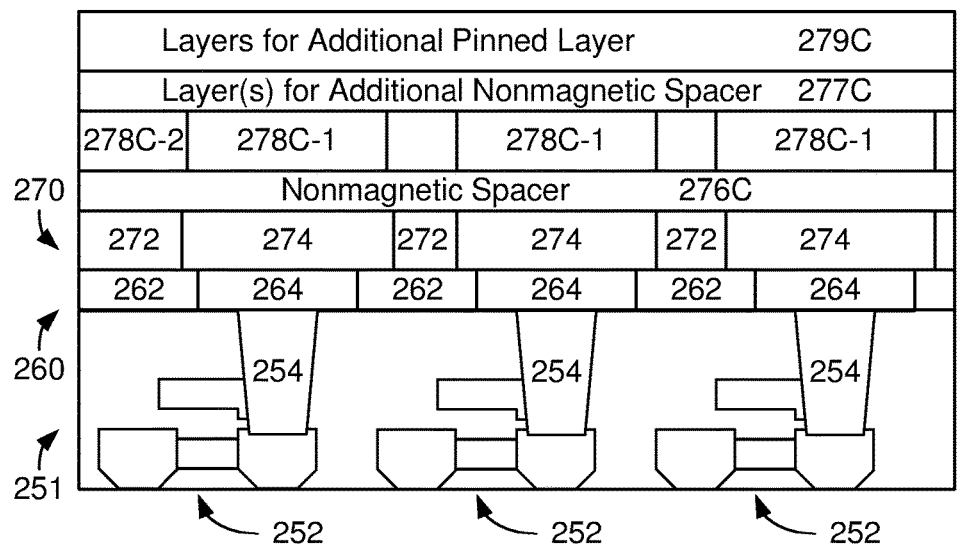
FIGS. 18-19 depict another exemplary embodiment of self-assembled magnetic junctions during fabrication.
Figure 19:
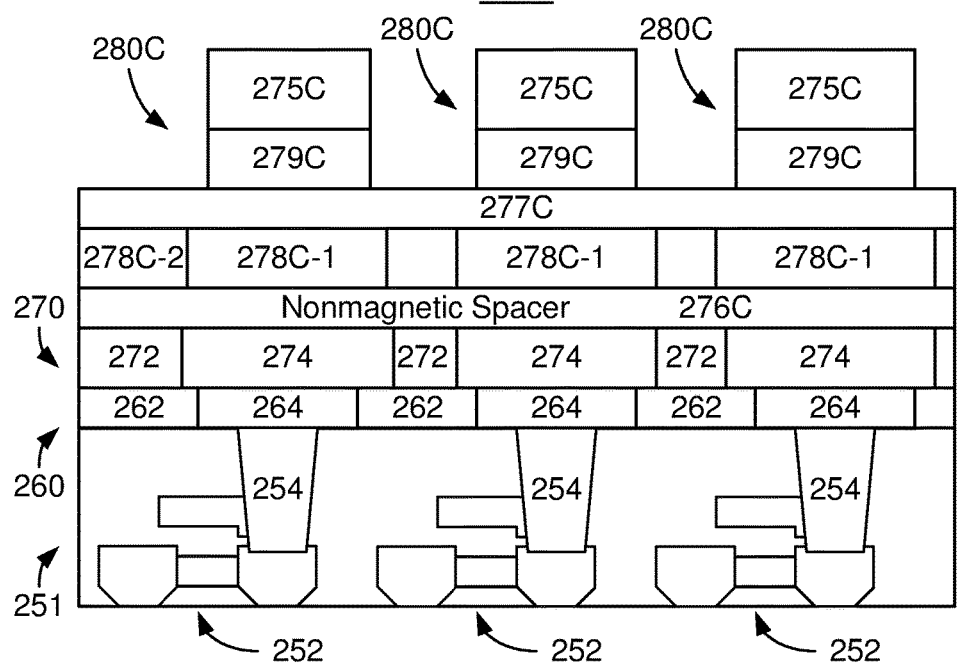
Figure 20:
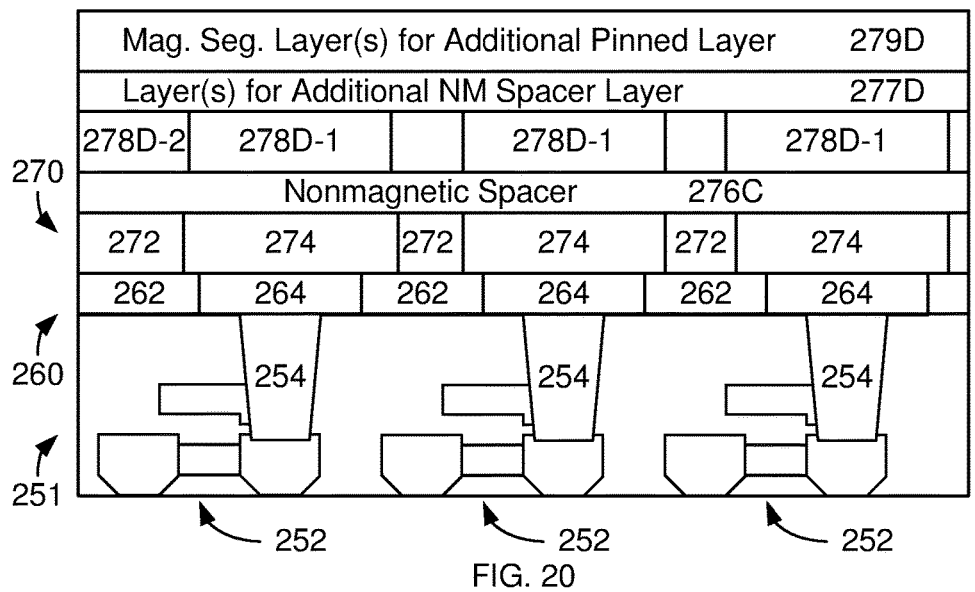
FIGS. 20-21 depict another exemplary embodiment of self-assembled magnetic junctions during fabrication.
Figure 21:
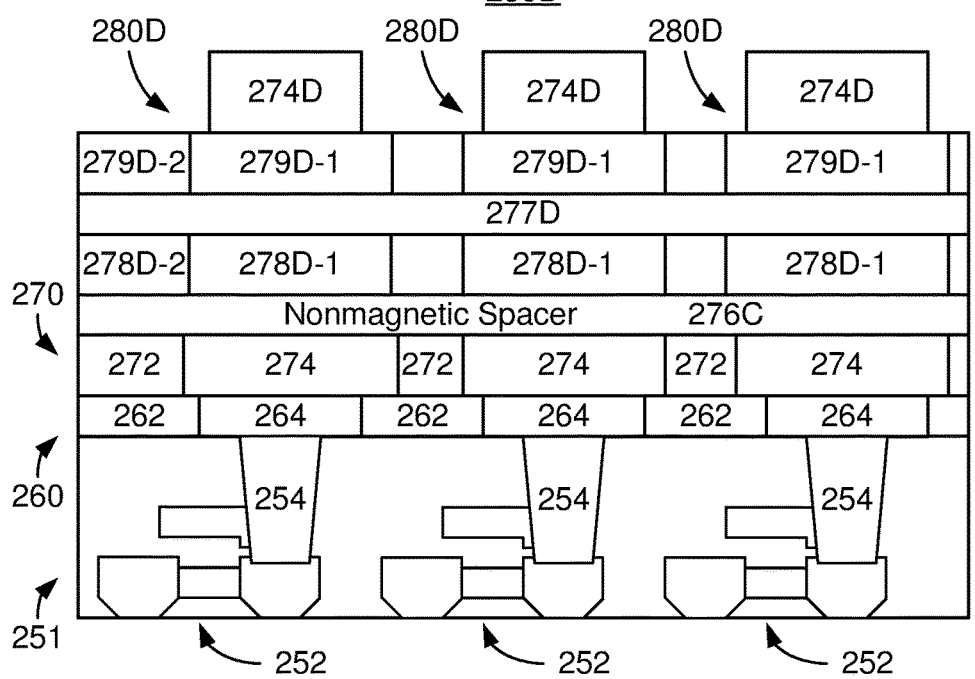

FIG. 18 depicts the magnetic device 250C during step 152. In FIG. 18, additional layers 277C and 279C have been deposited. These layers form an additional nonmagnetic spacer layer and an additional pinned layer in a dual magnetic junction. FIG. 19 depicts the magnetic device 250C after the upper layers have been defined in step 152 and the electrodes 275C have been provided. Thus, the additional nonmagnetic spacer layer 277C and additional pinned layer 279C have been provided. FIGS. 20 and 21 depict an alternate embodiment of the magnetic device 250D. FIG. 20 depicts the magnetic device 250D during step 152. Thus, layers 277D and 279D for the additional nonmagnetic spacer layer and additional pinned layer in a dual structure are shown. The layer 279D is another magnetic segregating layer. FIG. 21 depicts the magnetic device 250D after step 152 is completed. Thus, an anneal has been performed such that the magnetic segregation layer 279D has segregated into magnetic layer 279D-1 and insulator layer 279D-2. Only one instance of the insulator 279D-2 is labeled for clarity. The magnetic layers 279D-1 may align with the remaining magnetic layers 278D-1 and 274. Similarly, the insulator layers 279D-2 may align with the remaining insulator layers 278D-2 and 272.

The magnetic junctions 280B, 280C and/or 280D are formed using the method 140. The magnetic junction 280B/280C/280D may include a pinned layer 274, a nonmagnetic spacer layer 276 and free layer 278B-1. Alternatively, the free layer might be formed by the magnetic layer 274 and the pinned layer formed with layer 278B-1. For the dual structures, the additional pinned layers are formed from magnetic layers 279C-1 and 279D-1.

The magnetic devices 250B, 250C and 250D may share the benefits of the magnetic devices 250 and 250A. Removal processes for high aspect ratio components may be avoided. In addition, a single etch chemistry may be used in defining at least some of the layers such as layer 279C. As a result, the magnetic junctions 280B, 280C and/or 280D may be fabricated to be smaller and closer together. The magnetic device 250B, 250C and/or 250D maybe achieve a higher areal density. Fabrication may be improved for a higher density magnetic device 250/250A.

Although the method and apparatus have been described in the context of specific features, steps and components, one of ordinary skill in the art will recognize that one or more of these features, steps and/or components may be combined in other manners not inconsistent with the description herein.

Figure 22:
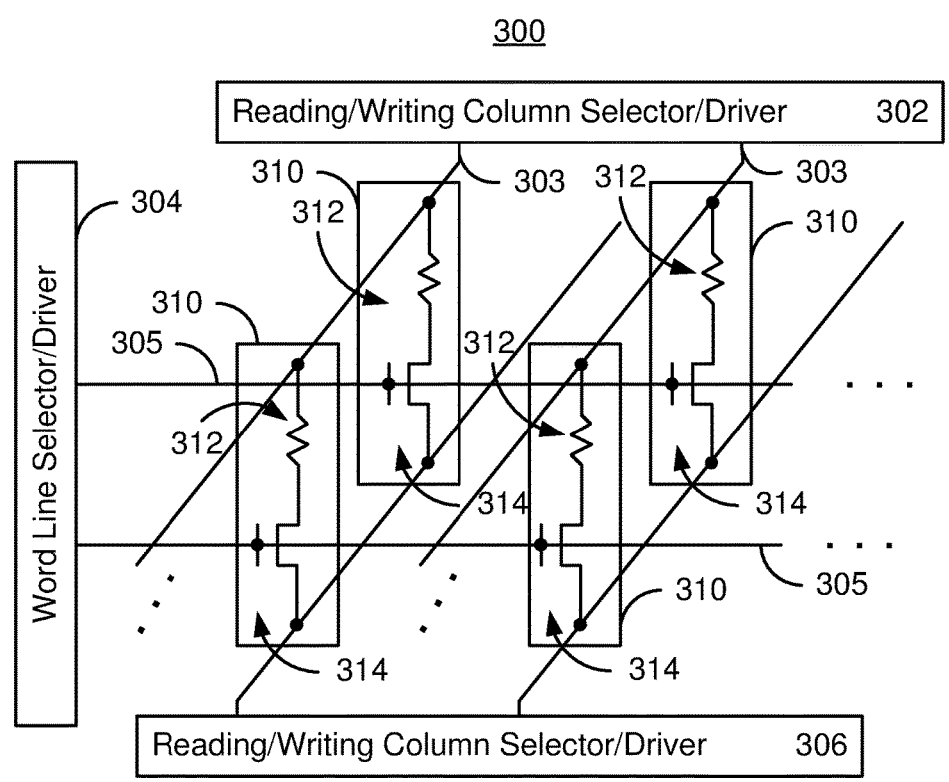
FIG. 22 depicts an exemplary embodiment of a memory utilizing magnetic junctions in the memory element(s) of the storage cell(s).

FIG. 22 depicts an exemplary embodiment of a memory 300 that may use one or more of the magnetic junctions 230, 280, 280A, 280B, 280C, 280D and/or other magnetic junction(s) formed in accordance with the methods described herein. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 230, 280, 280A, 280B, 280C, 280D and/or other magnetic junction(s) formed as disclosed herein. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a plurality of magnetic junctions on a substrate and usable in a magnetic device, the method comprising:
   providing a patterned seed layer, the patterned seed layer including a plurality of magnetic seed islands interspersed with an insulating matrix;
   providing at least a portion of a magnetoresistive stack after the step of providing the patterned seed layer, the magnetoresistive stack including at least one magnetic segregating layer, the at least one magnetic segregating layer including at least one magnetic material and at least one insulator;
   annealing the at least the portion of the magnetoresistive stack such that the at least one magnetic segregating layer segregates such that a plurality of portions of at least one magnetic material align with the plurality of magnetic seed islands and such that a plurality of portions of the at least one insulator align with the insulating matrix.

2. The method of claim 1 wherein each of the plurality of the magnetic junctions includes a pinned layer, a nonmagnetic spacer layer and a free layer, the nonmagnetic spacer layer being between the pinned layer and the free layer, a portion the plurality of portions of the at least one magnetic material aligned with the plurality of magnetic seed islands forming one of the pinned layer and the free layer, the method further including:
   providing a remaining portion of the magnetoresistive stack, the remaining portion of the magnetoresistive stack including a first layer for the nonmagnetic spacer layer and a second layer for an other of the pinned layer and the free layer.

3. The method of claim 2 further comprising:
defining at least the other of the pinned layer and the free layer from the remaining portion of the magnetoresistive stack.

4. The method of claim 2 further comprising:
providing a patterned top electrode layer including a plurality of electrodes aligned with the plurality of magnetic seed islands; and
defining at least the other of the pinned layer and the free layer from the remaining portion of the magnetoresistive stack after the step of providing the patterned top electrode layer.

5. The method of claim 2 wherein the each of the plurality of magnetic junctions further includes an additional pinned layer and an additional nonmagnetic spacer layer, the additional nonmagnetic spacer layer being between the additional pinned layer and the free layer, wherein the magnetoresistive stack further includes a third layer for the additional nonmagnetic spacer layer and a fourth layer for the additional pinned layer, and wherein the method further includes
defining at least the free layer and the additional pinned layer from the remaining portion of the magnetoresistive stack.

6. The method of claim 1 wherein each of the plurality of the magnetic junctions includes a pinned layer, a nonmagnetic spacer layer and a free layer, the nonmagnetic spacer layer being between the pinned layer and the free layer, a portion the plurality of portions of the at least one magnetic material aligned with the plurality of magnetic seed islands forming one of the pinned layer and the free layer, wherein the step of providing the at least the portion of the magnetoresistive stack further includes:
providing a first layer for the nonmagnetic spacer layer;
providing at least one additional segregating layer for an other of the pinned layer and the free layer, the at least one additional segregating layer including at least one additional magnetic material and at least one additional insulator, the at least one additional segregating layer segregating due to the step of providing the anneal such that a plurality of portions of the at least one additional magnetic material align with the plurality of portions of the at least one magnetic material for the plurality of magnetic junctions, a portion of the plurality of portions of the at least one additional magnetic material forming the other of the pinned layer and the free layer.

7. The method of claim 6 further comprising:
providing a plurality of electrodes aligned with the free layer.

8. The method of claim 1 wherein the at least one magnetic material includes at least one of FePt and CoPt and wherein the insulating matrix includes at least one of silicon oxide and aluminum oxide.

9. A method for providing a plurality of magnetic junctions residing on a substrate, each of the plurality of magnetic junctions including a pinned layer, a free layer and a nonmagnetic spacer layer between the pinned layer and the free layer, the method comprising:
providing a patterned seed layer, the patterned seed layer including a plurality of magnetic seed islands interspersed with an insulating matrix;
depositing a magnetic segregating layer, the magnetic segregating layer including a magnetic alloy and an insulator, the magnetic alloy including at least one of FePt and CoPt, the insulator being selected from silicon oxide aluminum oxide;
performing an anneal to segregate the magnetic segregating layer such that a plurality of portions of the magnetic material align with the plurality of magnetic seed islands and such that a plurality of portions of the insulator align with the insulating matrix, the plurality of portions of the magnetic material forming the pinned layer for the each of the plurality of magnetic junctions.

10. A magnetic memory comprising:
a patterned seed layer including a plurality of magnetic seed islands interspersed with an insulating matrix;
a plurality of magnetic storage cells, each of the plurality of magnetic storage cells including at least one magnetic junction aligned with the plurality of magnetic seed islands, the at least one magnetic junction including a free layer, a nonmagnetic spacer layer and a pinned layer, one of the pinned layer and the free layer being formed from at least one magnetic segregating layer including at least one magnetic material and at least one insulator, the at least one magnetic segregating layer being segregated such that a plurality of portions of the at least one magnetic material align with the magnetic seed islands and such that a plurality of portions of the at least one insulator align with the insulating matrix, a portion of the plurality of portions of the at least one magnetic material forming the one of the pinned layer and the free layer; and
a plurality of bit lines coupled with the plurality of magnetic storage cells.

11. The magnetic memory of claim 10 wherein each of the at least one magnetic junction further includes an additional nonmagnetic spacer layer and an additional pinned layer, the additional nonmagnetic spacer layer being between the free layer and the additional pinned layer.

12. The magnetic memory of claim 10 wherein the at least one magnetic material includes at least one of FePt and CoPt and wherein the at least one insulator includes at least one of silicon oxide and aluminum oxide.

13. The magnetic memory of claim 10 wherein an other of the pinned layer and the free layer is formed from at least one additional magnetic segregating layer, the at least one additional magnetic segregating layer including at least one additional magnetic material and at least one additional insulator, the at least one additional magnetic segregating layer being segregated such that a plurality of portions of at least one additional magnetic material align with the magnetic seed islands and such that a plurality of portions of the at least one additional insulator align with the insulating matrix, a portion of the plurality of portions of the at least one additional magnetic material forming the other of the pinned layer and the free layer.

14. The magnetic memory of claim 13 wherein the at least one additional magnetic material includes at least one of FePt and CoPt and wherein the at least one additional insulator includes at least one of silicon oxide and aluminum oxide.

15. The magnetic memory of claim 10 wherein the at least one magnetic material includes at least one of FePt and CoPt and wherein the insulating matrix includes at least one of silicon oxide and aluminum oxide.

* * * * *